US011261272B2

(12) United States Patent
Zhang et al.

(10) Patent No.: US 11,261,272 B2
(45) Date of Patent: *Mar. 1, 2022

(54) POLYOLEFIN COMPOSITION

(71) Applicant: Dow Global Technologies LLC, Midland, MI (US)

(72) Inventors: Kainan Zhang, Shanghai (CN); Yabin Sun, Shanghai (CN); Jeffrey M. Cogen, Flemington, NJ (US); Timothy J. Person, Pottstown, PA (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 100 days.

This patent is subject to a terminal disclaimer.

(21) Appl. No.: 16/620,044

(22) PCT Filed: Sep. 18, 2017

(86) PCT No.: PCT/CN2017/102074
§ 371 (c)(1),
(2) Date: Dec. 6, 2019

(87) PCT Pub. No.: WO2019/000654
PCT Pub. Date: Jan. 3, 2019

(65) Prior Publication Data
US 2020/0199270 A1 Jun. 25, 2020

(30) Foreign Application Priority Data
Jun. 29, 2017 (WO) ............... PCT/CN2017/090770

(51) Int. Cl.
| C08F 110/02 | (2006.01) |
| C09D 7/63 | (2018.01) |
| C08K 5/14 | (2006.01) |
| C09D 5/00 | (2006.01) |
| C09D 123/26 | (2006.01) |
| H01B 3/44 | (2006.01) |
| C08F 10/02 | (2006.01) |
| C08J 3/28 | (2006.01) |
| H01B 13/00 | (2006.01) |
| C08L 23/26 | (2006.01) |
| H01B 7/282 | (2006.01) |
| H01B 7/295 | (2006.01) |

(52) U.S. Cl.
CPC ............ *C08F 110/02* (2013.01); *C08F 10/02* (2013.01); *C08J 3/28* (2013.01); *C08K 5/14* (2013.01); *C08L 23/26* (2013.01); *C09D 5/00* (2013.01); *C09D 7/63* (2018.01); *C09D 123/26* (2013.01); *H01B 3/441* (2013.01); *H01B 13/0016* (2013.01); *C08F 2810/20* (2013.01); *C08J 2323/06* (2013.01); *C08L 2023/44* (2013.01); *C08L 2205/025* (2013.01); *C08L 2207/066* (2013.01); *C08L 2312/08* (2013.01); *H01B 7/282* (2013.01); *H01B 7/295* (2013.01)

(58) Field of Classification Search
USPC ................................... 525/288; 174/110 PM
See application file for complete search history.

(56) References Cited

U.S. PATENT DOCUMENTS

| 3,859,247 A | 1/1975 | MacKenzie, Jr. |
| 3,946,099 A | 3/1976 | MacKenzie, Jr. |
| 4,005,254 A | 1/1977 | MacKenzie, Jr. |
| 4,018,852 A | 4/1977 | Schober |
| 4,376,180 A | 3/1983 | Turbett et al. |
| 5,246,783 A | 9/1993 | Spenadel et al. |
| 5,346,961 A | 9/1994 | Shaw et al. |
| 5,367,030 A | 11/1994 | Gau et al. |
| 6,187,847 B1 | 2/2001 | Cogen et al. |
| 6,191,230 B1 | 2/2001 | Keogh et al. |
| 6,277,925 B1 | 8/2001 | Biswas et al. |
| 6,404,971 B2 | 6/2002 | Mehl |
| 6,496,629 B2 | 12/2002 | Ma |
| 6,714,707 B2 | 3/2004 | Rossi et al. |
| 6,936,655 B2 | 3/2005 | Borke et al. |
| 8,283,391 B2 * | 10/2012 | Easter ............... C08L 23/0815 523/173 |
| 8,426,519 B2 | 4/2013 | Cogen et al. |
| 8,449,801 B2 | 5/2013 | Hsiao et al. |
| 8,691,984 B2 | 4/2014 | Yamaura |
| 9,147,784 B2 | 9/2015 | Shirahige et al. |
| 9,670,351 B2 | 6/2017 | Siddhamalli et al. |
| 2002/0198335 A1 | 12/2002 | Bernier et al. |
| 2003/0166817 A1 | 9/2003 | Degussa |
| 2008/0114134 A1 * | 5/2008 | Pohl ..................... C08K 5/5425 525/474 |
| 2008/0176981 A1 | 7/2008 | Biscoglio et al. |

(Continued)

FOREIGN PATENT DOCUMENTS

| CA | 2732755 | 2/2010 |
| CN | 1803907 | 7/2006 |

(Continued)

OTHER PUBLICATIONS

Liu Gang, et al., Study on cyclosiloxane containing vinylphenyl as crosslinking agent in polypropylene, New Chemical Materials, Oct. 31, 2006, No. 10, vol. 34, pp. 78-80.
F.O. Stark et al., Silicones, Comprehensive Organometallic Chemistry, vol. 2, 305, Pergamon Press (1982).
Introduction to Polymer Chemistry, Stille, Wiley and Sons, New York, 1962, pp. 149 to 151.
J. Wu., et al., Crosslinking of low density polyethylene with Octavinyl polyhedral oligomeric silsesquioxane as the crosslinker, RSC Advances, 2014, vol. 4, p. 44030.

(Continued)

Primary Examiner — Fred M Teskin

(57) ABSTRACT

A polyolefin composition comprising a polyolefin polymer, an alkenyl-functional monocyclic organosiloxane, and an organic peroxide; products made therefrom; methods of making and using same; and articles containing same.

18 Claims, No Drawings

(56) References Cited

U.S. PATENT DOCUMENTS

| | | | |
|---|---|---|---|
| 2014/0056516 A1 | 2/2014 | Wee et al. | |
| 2015/0376386 A1 | 12/2015 | Kim et al. | |
| 2020/0199340 A1* | 6/2020 | Sun | H01B 3/441 |

FOREIGN PATENT DOCUMENTS

| | | |
|---|---|---|
| CN | 101104706 | 1/2008 |
| CN | 102838827 | 12/2012 |
| CN | 103360712 | 10/2013 |
| CN | 103865420 | 6/2014 |
| CN | 104277182 | 1/2015 |
| CN | 104610634 | 5/2015 |
| CN | 104877171 | 9/2015 |
| CN | 106674999 | 5/2017 |
| DE | 2001205 | 7/1970 |
| DE | 102006017346 | 10/2007 |
| EP | 1433811 | 6/2004 |
| EP | 2889323 | 7/2015 |
| ES | 373818 | 2/1972 |
| FR | 2033903 | 12/1970 |
| GB | 1277378 | 6/1972 |
| JP | 48024492 | 7/1973 |
| JP | 11060748 | 3/1999 |
| NL | 7001224 | 8/1970 |
| SE | 368579 | 7/1974 |
| WO | 1996039459 | 12/1996 |
| WO | 2014030948 | 2/2014 |
| WO | 2015149221 | 10/2015 |
| WO | 2016187755 | 12/2016 |

OTHER PUBLICATIONS

Li, P., A brief product introduction of the organic modified siloxane and applications, Evonik Industries, Nov. 2014.

Wiley Periodicals, Inc. Engineering properties of electron beam-crosslinked ethylene methyl acrylate copolymer. J Appl Polym Sci, 2010.

Pentavinylpentamethylcyclopentasiloxane, 95%, Gelest, Inc., p. 1-6, vol. 77, No. 58, Dec. 4, 2014.

Reactive Silicones: Forging New Polymer Links, Gelest, Inc., p. 13.

* cited by examiner

POLYOLEFIN COMPOSITION

CROSS-REFERENCE TO RELATED APPLICATION(S)

This application claims benefit of priority from, and hereby incorporates by reference the entire contents of, PCT International Patent Application Number PCT/CN2017/090770 filed Jun. 29, 2017.

FIELD

The field includes polyolefin compositions, products made therefrom, methods of making and using same, and articles containing same.

INTRODUCTION

Insulated electrical conductors typically comprise a conductive core covered by an insulation layer. The conductive core may be solid or stranded (e.g., a bundle of wires). Some insulated electrical conductors may also contain one or more additional elements such as semiconducting layer(s) and/or a protective jacket (e.g., wound wire, tape, or sheath). Examples are coated metal wires and electrical power cables, including those for use in low voltage ("LV", >0 to <5 kilovolts (kV)), medium voltage ("MV", 5 to <69 kV), high voltage ("HV", 69 to 230 kV) and extra-high voltage ("EHV", >230 kV) electricity-transmitting/distributing applications. Evaluations of power cables may use AEIC/ICEA standards and/or IEC test methods.

U.S. Pat. No. 4,005,254 to B. T. MacKenzie, Jr. ("MacKenzie") relates to a pressureless cure system for chemically cross-linking ethylene containing polymers, and product formed thereby. A curable composition comprises an ethylene-containing polymer, a curing agent, and a mineral filler treated with tetramethyttetravinylcyclotetrasiloxane. In preparing the composition, the polymer, mineral filler, tetramethyttetravinylcyclotetrasiloxane, and other additives are intimately admixed as in a Banbury. During this compounding operation, the tetramethyttetravinylcyclotetrasiloxane is said to interact or coat the filler, and the result is referred to as siloxane treated filler. Where desired, the mineral filler may be pretreated with the tetramethyttetravinylcyclotetrasiloxane in a separate operation, and the siloxane treated filler is then admixed with the polymer and other additives. MacKenzie's Toluene Extract (% on compound) data for Example 1 (0.0 weight percent (wt %)tetramethyttetravinylcyclotetrasiloxane) is 11.6% and for Examples 2 and 3 (each 0.97 wt % tetramethyttetravinylcyclotetrasiloxane based on composition weight) are 9.6% and 11.8%, respectively (Table I). In view of the percent extractables for comparative Example 1 relative to those for Examples 2 and 3, it would be recognized by a skilled artisan that the tetramethyltetravinylcyclotetrasiloxane in Examples 2 and 3 did not contribute to crosslinking of the ethylene-containing polymer. Instead the tetramethyttetravinylcyclotetrasiloxane coated the aluminum silicate filler, as taught by MacKenzie.

U.S. Pat. No. 8,426,519 B2 to J. M. Cogen, et al. relates to silicone-thermoplastic polymer reactive blends and copolymer products prepared using economical post-reactor reactive mixing, e.g., extrusion. The procedure is based on the ring-opening polymerization of cyclic siloxanes within a thermoplastic polymer matrix. In a preferred mode, the thermoplastic polymer is a polyolefin, optionally containing silane groups that are available for reaction with the silicone polymer that is formed in situ. The resulting materials provide hybrid performance that can extend the range of applications beyond those which are served by thermoplastic polymers or silicones alone, or their physical blends.

CN104277182A to Z-I Wu et al., and the article *Crosslinking of low density polyethylene with Octavinyl polyhedral oligomericsilsesquioxane as the crosslinker*, J. Wu., et al., RSC Advances, 2014, volume 4, page 44030, relate to a method of preparing a crosslinked low density polyethylene using an octavinyl polyhedral oligomericsilsesquioxane as a crosslinker.

SUMMARY

We recognized a problem that hurts the crosslinking and performance of prior polyolefins. Coagents may be blended with polyolefins to give polyolefin compositions with increased crosslinking capability, but conventional coagents have their limitations. For example, a conventional coagent typically has limited solubility or miscibility in polyolefin compositions. This limits the coagent's maximum loading level in the composition. It also causes the coagent to undesirably migrate to the surface of the composition (e.g., surface of pellets), limiting the composition's storage lifetime. Conventional coagents also pose other problems. For example, upon curing they may yield crosslinked products with insufficient extent of crosslinking. Or the compositions may cure too slowly for use in certain manufacturing operations (e.g., power cable manufacturing, injection molding, and film extrusion). Or the compositions may cure prematurely (i.e., to be prone to scorch during cable extrusion, injection molding, and film extrusion). Not surprisingly, these problems have limited the structures of conventional coagents that have been used with polyolefins. Typically, conventional coagents comprise conventional substructural groups bonded to two or more olefinic crosslinking groups. The conventional substructural groups are acyclic or cyclic multivalent groups that comprise a backbone or ring, respectively, containing in the backbone or ring carbon atoms and, optionally, nitrogen and/or oxygen atoms, but not silicon atoms.

The problem hurts the performance of power cables operating at higher voltages. Scorch can occur during extrusion of, and ultimately lead to failure of, the insulation layer. The time to reach such failure can be lengthened, and thus reliability of power delivery increased and maintenance costs decreased, by using a more resilient material in the insulation layer.

A technical solution to this problem was not obvious from the prior art. A problem to be solved by inventiveness then is to discover a new polyolefin composition comprising a polyolefin polymer and an improved coagent, wherein the polyolefin composition, and a crosslinked product of curing thereof, are useful as insulation layers in power cables at higher voltages (HV or EHV power cables). Our analysis suggests that the new coagent ideally would be a cyclic molecule that does not contain carbon or nitrogen atoms in its ring.

Our technical solution to this problem includes a polyolefin composition comprising a polyolefin polymer and an alkenyl-functional monocyclic organosiloxane; crosslinked polyolefin products made therefrom; methods of making and using same; and articles containing same.

The inventive polyolefin composition and products are useful in any application in which polyolefins, including crosslinked polyolefins, are utilized, including extruded articles, coatings, films, sheets and injection molded articles, as well as electricity transmitting applications and other unrelated applications such as containers or vehicle parts.

DETAILED DESCRIPTION

The Summary and Abstract are incorporated here by reference.

The inventive polyolefin composition containing the polyolefin polymer and the alkenyl-functional monocyclic organosiloxane may be cured (crosslinked) via irradiation or an organic peroxide without ring opening of the alkenyl-functional monocyclic organosiloxane. The curing reaction is conducted in such a way that the alkenyl-functional monocyclic organosiloxane does not give a polymerized siloxane (silicone polymer). Without being bound by theory it is believed that the constituents of the polyolefin composition are chosen such that during curing of the polyolefin composition the alkenyl-functional monocyclic organosiloxane does not ring-open to give a ring-opened silanol (S—OH)-functional organosiloxane oligomer (linear or branched), and therefore the polymerized siloxane (silicone polymer) is not formed in situ within the polyolefin polymer. The alkenyl-functional monocyclic organosiloxane cannot undergo ring-opening at least in part because the polyolefin composition does not contain, and thus because the curing reaction is conducted in the absence of, a ring opening catalyst. The excluded ring-opening catalysts are known and include a phosphazene base. The phosphazene base has a core structure P=N, in which free N valencies are linked to hydrogen, hydrocarbyl, —P=N or =P—N, and free P valencies are linked to =N or —N. Examples of phosphazene bases are found in U.S. Pat. No. 8,426,519 B2, column 9, line 29, to column 10, line 31. Other types of ring opening catalysts, which are excluded from the polyolefin composition and hence from the crosslinked polyolefin product prepared therefrom, are known. For examples, see F. O. Stark et al., Silicones, Comprehensive Organometallic Chemistry, volume 2, 305, Pergamon Press (1982). Examples are strong acids such as trifluoromethanesulfonic acid and its metal salts, sulfuric acid, perchloric acid, and hydrochloric acid; cationic ring opening catalysts such as metal halides; and anionic ring opening catalysts such as organolithiums, alkali metal oxides, and alkali metal hydroxides. In the absence of the ring opening catalyst, the inventive polyolefin composition undergoes crosslinking of the alkenyl-functional monocyclic organosiloxane to the polyolefin polymer via free-radical curing to form the crosslinked polyolefin product. The inventive crosslinking beneficially occurs without ring opening of the alkenyl-functional monocyclic organosiloxane even in the presence of ambient moisture. Embodiments of the inventive crosslinking avoid the harmful effect(s) of phosphazene base on crosslinking level (extent or degree of crosslinking).

Unpredictably, the inventive polyolefin composition containing the alkenyl-functional monocyclic organosiloxane, or the inventive crosslinked polyolefin product prepared therefrom, has at least one improved property relative to a comparative polyolefin composition that contains either a linear vinyl methoxysiloxanehomopolymer (oligomer), vinyl, methylsiloxanehomopolymer (oligomer), or a cage-like vinyl functional silsesquioxane, or product prepared therefrom, respectively. The improved property may be a shorter time period to achieve 90% crosslinking ("T90") in the crosslinked polyolefin product, as measured by the T90 Crosslinking Time Test Method described later, which indicates a beneficially faster curing rate; a greater maximum torque value ("MH"), as measured by the T90 Crosslinking Time Test Method, which indicates a beneficially greater extent of crosslinking in the crosslinked polyolefin product; an increased time to scorch ("ts1") at 140° C., as measured by the Scorch Time Test Method described later, which indicates a beneficially increased resistance to premature curing of the polyolefin composition during extrusion (e.g., curing in an extruder instead of in a post-extruder operation); and/or an ability of the alkenyl-functional monocyclic organosiloxaneto be loaded into the polyolefin polymer at greater concentrations without "sweat out" of the alkenyl-functional monocyclic organosiloxane, compared to what is possible with loading conventional coagents in the polyolefin polymer. The "sweat out" is as determined by the Migration Measurement Test Method or the Surface Migration Test Method described later, during storage of the polyolefin composition over a period of time, which indicates greater compatibility and/or solubility of the alkenyl-functional monocyclic organosiloxane (as a silicon-based coagent) in the polyolefin polymer of the polyolefin composition.

The inventive polyolefin composition contains an organic peroxide as cure agent, and the resulting inventive crosslinked polyolefin product is made by curing same and may be characterized by a greater extent of crosslinking (a greater number of crosslinks) than could be achieved in a comparative crosslinked polyolefin product made by curing a comparative polyolefin composition that contains polyolefin and organic peroxide but which is free of the alkenyl-functional monocyclic organosiloxane. The resulting inventive crosslinked polyolefin product may have a greater extent of crosslinking than could be achieved using a conventional coagent in place of the alkenyl-functional monocyclic organosiloxane. The polyolefin composition may have a longer shelf life without experiencing "sweat out", perhaps due to higher solubility of the alkenyl-functional monocyclic organosiloxane in the polyolefin polymer than that of the conventional coagent in polyolefin polymer. The inventive polyolefin composition may have a shorter T90 crosslinking time (faster crosslinking) than could be achieved using a conventional coagent in place of the alkenyl-functional monocyclic organosiloxane. The inventive crosslinked polyolefin product may have greater resistance to scorch (e.g., ts1 at 140 C.) compared to the comparative crosslinked polyolefin product when the latter is formulated to have the same number of crosslinks as the former.

Certain inventive embodiments are described below as numbered aspects for easy cross-referencing. Additional embodiments are described elsewhere herein.

Aspect 1. A polyolefin composition comprising (A) a polyolefin polymer that is a low density polyethylene (LDPE) polymer comprising 50 to 100 weight percent (wt %) ethylenic monomeric units, 50 to 0 wt % ($C_3$-$C_{20}$)alpha-olefin-derived comonomeric units, and 20 to 0 wt % diene-comonomeric units, wherein total weight percent is 100.00 wt %; a crosslinking effective amount of (B) a monocyclic organosiloxane of formula (I): $[R^1,R^2SiO_{2/2}]_n$ (I), wherein subscript n is an integer greater than or equal to 3; each $R^1$ is independently a ($C_2$-$C_4$)alkenyl or a $H_2C=C(R^{1a})$—C(=O)—O—$(CH_2)_m$— wherein $R^{1a}$ is H or methyl and subscript m is an integer from 1 to 4; and each $R^2$ is independently H, ($C_1$-$C_4$)alkyl, phenyl, or $R^1$; and (C) an organic peroxide; with the proviso that the polyolefin composition is free of (i.e., lacks) a phosphazene base. In some aspects the polyolefin composition is free of any ring opening catalyst. In some aspects when subscript n is 4, the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof. In some aspects n is 3, 4, 5, or 6; alternatively 3, 4, or 5; alternatively 5 or 6; alternatively 3 or 4; alternatively 3; alternatively 4; alternatively 5; alternatively 6.

Aspect 2. A polyolefin composition comprising (A) a polyolefin polymer that is a low density polyethylene (LDPE) polymer comprising 50 to 100 weight percent (wt %) ethylenic monomeric units, 50 to 0 wt % ($C_3$-$C_{20}$)alpha-olefin-derived comonomeric units, and 20 to 0 wt % diene-comonomeric units, wherein total weight percent is 100.00 wt %; (B) a monocyclic organosiloxane of formula (I): $[R^1,R^2SiO_{2/2}]_n$ (I), wherein subscript n is an integer greater than or equal to 3; each $R^1$ is independently a ($C_2$-$C_4$)alkenyl or a $H_2C=C(R^{1a})-C(=O)-O-(CH_2)_m-$ wherein $R^{1a}$ is H or methyl and subscript m is an integer from 1 to 4; and each $R^2$ is independently H, ($C_1$-$C_4$)alkyl, phenyl, or $R^1$; and (C) an organic peroxide; with the proviso that when subscript n is 4, the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and with the proviso that the polyolefin composition is free of a phosphazene base. In some aspects the polyolefin composition is free of any ring opening catalyst. In some aspects n is 3, 4, 5, or 6; alternatively 3, 4, or 5; alternatively 5 or 6; alternatively 3 or 4; alternatively 3; alternatively 4; alternatively 5; alternatively 6.

Aspect 3. The polyolefin composition of aspect 1 or 2 wherein subscript n is 3 and the (B) monocyclic organosiloxane of formula (I) is described by any one of limitations (i) to (x): (i) each $R^1$ is independently a ($C_2$-$C_3$)alkenyl; and each $R^2$ is independently H, ($C_1$-$C_2$)alkyl, or ($C_2$-$C_3$)alkenyl; (ii) each $R^1$ is vinyl; and each $R^2$ is independently ($C_1$-$C_2$)alkyl; (iii) each $R^1$ is vinyl; and each $R^2$ is methyl; (iv) each $R^1$ is allyl; and each $R^2$ is independently ($C_1$-$C_2$)alkyl; (v) each $R^1$ is allyl; and each $R^2$ is methyl; (vi) each $R^1$ is independently $H_2C=C(R^{1a})-C(=O)-O-(CH_2)_m-$ wherein $R^{1a}$ is H or methyl and subscript m is an integer from 1 to 4; and each $R^2$ is independently H, ($C_1$-$C_2$)alkyl, or ($C_2$-$C_3$)alkenyl; (vii) each $R^1$ is independently $H_2C=C(R^{1a})-C(=O)-O-(CH_2)_m-$ wherein $R^{1a}$ is H and subscript m is 3; and each $R^2$ is independently ($C_1$-$C_2$)alkyl; (viii) each $R^1$ is independently $H_2C=C(R^{1a})-C(=O)-O-(CH_2)_m-$ wherein $R^{1a}$ is methyl and subscript m is 3; and each $R^2$ is independently ($C_1$-$C_2$)alkyl; (ix) the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

Aspect 4. The polyolefin composition of aspect 1 or 2 wherein subscript n is 4 and the (B) monocyclic organosiloxane of formula (I) is described by any one of limitations (i) to (x): (i) each $R^1$ is independently a ($C_2$-$C_3$)alkenyl; and each $R^2$ is independently H, ($C_1$-$C_2$)alkyl, or ($C_2$-$C_3$)alkenyl; (ii) each $R^1$ is vinyl; and each $R^2$ is independently ($C_1$-$C_2$)alkyl; (iii) each $R^1$ is vinyl; and each $R^2$ is methyl; (iv) each $R^1$ is allyl; and each $R^2$ is independently ($C_1$-$C_2$) alkyl; (v) each $R^1$ is allyl; and each $R^2$ is methyl; (vi) each $R^1$ is independently $H_2C=C(R^{1a})-C(=O)-O-(CH_2)_m-$ wherein $R^{1a}$ is H or methyl and subscript m is an integer from 1 to 4; and each $R^2$ is independently H, ($C_1$-$C_2$)alkyl, or ($C_2$-$C_3$)alkenyl; (vii) each $R^1$ is independently $H_2C=C(R^{1a})-C(=O)-O-(CH_2)_m-$ wherein $R^{1a}$ is H and subscript m is 3; and each $R^2$ is independently ($C_1$-$C_2$)alkyl; (viii) each $R^1$ is independently $H_2C=C(R^{1a})-C(=O)-O-(CH_2)_m-$ wherein $R^{1a}$ is methyl and subscript m is 3; and each $R^2$ is independently ($C_1$-$C_2$)alkyl; (ix) the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of any inorganic filler; and (x) a combination of limitation (ix) and any one of limitations (i) to (viii).

Aspect 5. The polyolefin composition of aspect 1 or 2 wherein subscript n is 5 or 6 and the (B) monocyclic organosiloxane of formula (I) is described by any one of limitations (i) to (x): (i) each $R^1$ is independently a ($C_2$-$C_3$) alkenyl; and each $R^2$ is independently H, ($C_1$-$C_2$)alkyl, or ($C_2$-$C_3$)alkenyl; (ii) each $R^1$ is vinyl; and each $R^2$ is independently ($C_1$-$C_2$)alkyl; (iii) each $R^1$ is vinyl; and each $R^2$ is methyl; (iv) each $R^1$ is allyl; and each $R^2$ is independently ($C_1$-$C_2$)alkyl; (v) each $R^1$ is allyl; and each $R^2$ is methyl; (vi) each $R^1$ is independently $H_2C=C(R^{1a})-C(=O)-O-(CH_2)_m-$ wherein $R^{1a}$ is H or methyl and subscript m is an integer from 1 to 4; and each $R^2$ is independently H, ($C_1$-$C_2$)alkyl, or ($C_2$-$C_3$)alkenyl; (vii) each $R^1$ is independently $H_2C=C(R^{1a})-C(=O)-O-(CH_2)_m-$ wherein $R^{1a}$ is H and subscript m is 3; and each $R^2$ is independently ($C_1$-$C_2$)alkyl; (viii) each $R^1$ is independently $H_2C=C(R^{1a})-C(=O)-O-(CH_2)_m-$ wherein $R^{1a}$ is methyl and subscript m is 3; and each $R^2$ is independently ($C_1$-$C_2$)alkyl; (ix) the polyolefin composition does not contain 24 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

Aspect 6. The polyolefin composition of any one of aspects 1 to 5 described by any one of limitations (i) to (vii): (i) the (A) polyolefin polymer is characterized by a density from 0.86 to 0.97 gram per cubic centimeter (g/$cm^3$) as measured by ASTM D792-13, Method B, in 2-propanol; (ii) the (A) polyolefin polymer is from 80 to 99.89 weight percent (wt %) of the weight of the polyolefin composition; (iii) the (B) monocyclic organosiloxane of formula (I) is from 0.1 to 3 wt % of the polyolefin composition; and the (C) organic peroxide is from 0.01 to 4.5 wt % of the polyolefin composition; (iv) both (i) and (ii); (v) both (i) and (iii); (vi) both (ii) and (iii); and (vii) each of (i), (ii), and (iii).

Aspect 7. The polyolefin composition of any one of aspects 1 to 6 further comprising at least one additive selected from the group consisting of: (D) a conventional coagent; (E) an antioxidant; (F) a filler; (G) a flame retardant; (H) a hindered amine stabilizer; (I) a tree retardant; (J)

a methyl radical scavenger; (K) a scorch retardant, (L) a nucleating agent, and (M) carbon black; with the proviso that the total amount of the at least one additive is from >0 to 70 wt %, alternatively from >0 to 60 wt %, alternatively from >0 to 40 wt %, alternatively from >0 to 20 wt % of the polyolefin composition and with the proviso that the (F) filler does not include any omitted filler. In some aspects the polyolefin composition further comprises the (E) antioxidant; alternatively the (E) antioxidant and the (H) hindered amine stabilizer.

Aspect 8. A method of making a polyolefin composition, the method comprising mixing (A) a polyolefin polymer that is a low density polyethylene (LDPE) polymer comprising 50 to 100 weight percent (wt %) ethylenic monomeric units, 50 to 0 wt % ($C_3$-$C_{20}$)alpha-olefin-derived comonomeric units, and 20 to 0 wt % dienecomonomeric units, wherein total weight percent is 100.00 wt %; (B) a monocyclic organosiloxane of formula (I): $[R^1,R^2SiO_{2/2}]_n$(I), and (C) an organic peroxide together to make the polyolefin composition of any one of aspects 1 to 6. The subscript n and groups $R^1$ and $R^2$ are as defined in any one of aspects 1 to 5. The (A) polyolefin polymer is as defined in any one of aspects 1, 2, and 6. The method may further comprise mixing at least one of the additives defined in aspect 7 with the constituents (A), (B), and (C) to make the polyolefin composition of aspect 7.

Aspect 9. A method of free-radical curing a polyolefin composition of any one of aspects 1 to 7 to make a crosslinked polyolefin product, the method comprising heating the polyolefin composition at a curing effective temperature in such a way so as to react the (A) polyolefin polymer with the (B) monocyclic organosiloxane of formula (I), thereby making a crosslinked polyolefin product. In some aspects the polyolefin composition and crosslinked polyolefin product are free of a phosphazene base, alternatively any ring-opening catalyst. In some aspects the polyolefin composition is the polyolefin composition of any one of aspects 1 to 6. The combination of the crosslinking effective amount of (B) and (C) an organic peroxide with the curing effective temperature, and any other desired reaction conditions (e.g., pressure or inert gas atmosphere) is sufficient to cure the polyolefin composition and make the crosslinked polyolefin product under the circumstances.

Aspect 10. A crosslinked polyolefin product made by the method of curing of aspect 9.

Aspect 11. A manufactured article comprising a shaped form of the polyolefin composition of any one of aspects 1 to 7 or the crosslinked polyolefin product of aspect 10. In some aspects the manufactured article is selected from: coatings, films, sheets, extruded articles, and injection molded articles. E.g., coated conductors, coatings of wire and cables for transmitting electric power or telecommunications, agricultural film, food packaging, garment bags, grocery bags, heavy-duty sacks, industrial sheeting, pallet and shrink wraps, bags, buckets, freezer containers, lids, toys.

Aspect 12. A coated conductor comprising a conductive core and an insulation layer at least partially covering the conductive core, wherein at least a portion of the insulation layer comprises the polyolefin composition of any one of aspects 1 to 7 or the crosslinked polyolefin product of aspect 10. Embodiments of the conductive core may be a wire having proximal and distal ends, at least one of which may be free of the insulation layer.

Aspect 13. A method of transmitting electricity, the method comprising applying a voltage across the conductive core of the coated conductor of aspect 12 so as to generate a flow of electricity through the conductive core. The conductive core may be a wire having proximal and distal ends and the electricity may flow from one end to the other end of the wire.

The term "coagent" means a compound that enhances crosslinking, i.e., a curing coagent. "Conventional coagent" is an acyclic or cyclic compound that enhances crosslinking and contains carbon atoms in its respective backbone or ring substructure. Thus, the backbone or ring substructure of the conventional coagent is based on carbon (carbon-based substructure). In contrast a silicon-based coagent means an acyclic or cyclic compound that enhances crosslinking and that contains silicon atoms in its respective backbone or ring substructure. The (B) monocyclic organosiloxane of formula (I) is a cyclic silicon-based coagent.

The terms "curing" and "crosslinking" are used interchangeably herein to mean forming a crosslinked product (network polymer) without ring opening polymerization.

The expression "curing effective temperature" is an extent or degree of thermal energy sufficient to initiate decomposition of (C) organic peroxide so as to being a (free radical) reaction between constituents (A) and (B).

The term "ethylene-containing polymer" means a macromolecule containing repeat units derived from $H_2C=CH_2$.

The term "(meth)acrylate" includes acrylate, methacrylate, and a combination thereof. The (meth)acrylate may be unsubstituted.

The term "ring opening catalyst" as used herein means a substance that initiates a ring opening polymerization reaction, and/or enhances the rate of a ring opening polymerization reaction, of a cyclic siloxane monomer.

The term "ring opening polymerization" as used herein is a type of chain growth polymerization reaction wherein a reactive end of a polymer chain opens the ring of a cyclic monomer to give a longer polymer chain.

The polyolefin composition: a single phase or multiphase, uniform or non-uniform, continuous phase or discontinuous phase, crosslinkable material containing macromolecules composed of repeat units derived from one or more monomers containing carbon-carbon double bonds and molecules of an alkenyl-functional monocyclic organosiloxane. In some aspects the polyolefin composition may further contain one, two, or more optional ingredients or additives. The weight of the polyolefin composition is 100.00 wt %.

The polyolefin composition may be made by a number of different ways. In some aspects the polyolefin composition may be made by mixing a melt of the (A) polyolefin polymer with the (B) monocyclic organosiloxane of formula (I) and (C) organic peroxide, and any optional constituents (e.g., any zero, one or more of constituents (D) to (M) to give the polyolefin composition as an admixture of constituents (A), (B), (C), and the any optional constituents. The mixing may comprise compounding, kneading, or extruding. To facilitate mixing one or more constituents (e.g., (B), additives (C), (D), (E), and etc.) may be provided in the form of an additive masterbatch in a portion of (A).

In another aspect, the polyolefin composition may be made by contacting the (B) monocyclic organosiloxane of formula (I), and optionally zero, one or more of any optional constituents (e.g., (D) antioxidant), with an unmelted form of the (A) polyolefin polymer to give the polyolefin composition as an admixture of constituents (A), (B), and the any optional constituents. The contacting may comprise soaking, imbibing or injecting. Constituent (B) and any optional constituent(s) independently may be combined by compounding, extruding, imbibing, injecting, kneading, or soaking. The mixing or contacting may be carried out at a temperature from about 20° to 100° C. for 0.1 to 100 hours, e.g., 60° to 80° C. for 0.1 to 24 hours. Higher temperatures may be used for the mixing or contacting with the proviso that the (C) organic peroxide is not subjected thereto. Thereafter if desired, the admixture may be cooled to a temperature below a peroxide decomposition temperature before being mixed or contacted with (C) organic peroxide. If desired the polyolefin composition may be cooled to a storage temperature (e.g., 23° C.) and stored for a period of time of 1 hour, 1 week, 1 month, or longer.

The polyolefin composition may be prepared as a one-part formulation, alternatively a multi-part formulation such as a two-part formulation, alternatively a three-part formulation. There is no inherent reason why any combination of constituents cannot be included in either part or parts of these formulations.

The constituent (A) polyolefin polymer: a crosslinkable macromolecule composed of repeat units made from an olefin monomer and optionally one or more olefin-functional comonomers, wherein the macromolecule has a backbone consisting essentially of, or consisting of carbon atoms, or a collection of such crosslinkable macromolecules, which and yield a network structure upon being crosslinked with constituent (B). The (A) may be a homopolymer containing repeat units derived from the same monomer or an interpolymer, also referred to as a copolymer, containing repeat units derived from a monomer and repeat units derived from a comonomer that is different than the monomer. Interpolymer includes bipolymers, terpolymers, etc. In some aspects (A) is free of silicon atoms.

The (A) polyolefin polymer may be a polyethylene homopolymer containing 99 to 100 wt % ethylenic monomeric units. The polyethylene homopolymer may be high density polyethylene (HDPE) homopolymer made by coordination polymerization or a low density polyethylene (LDPE) homopolymer made by radical polymerization.

Alternatively, The (A) polyolefin polymer may be an ethylene/alpha-olefin copolymer containing 50 to <100 wt % ethylenic monomeric units and 50 to 0 wt % ($C_3$-$C_{20}$) alpha-olefin-derived comonomeric units. The ethylene/alpha-olefin copolymer embodiment of (A) ethylene/alpha-olefin copolymer may be a linear low density polyethylene (LLDPE), medium density polyethylene (MDPE), or high density polyethylene (HDPE). Alternatively, the polyolefin polymer may be a low density polyethylene (LDPE). The ethylene/alpha-olefin ("α-olefin") interpolymer having an α-olefin content of at least 1 wt %, at least 5 wt %, at least 10 wt %, at least 15 wt %, at least 20 wt %, or at least 25 wt % based on the entire interpolymer weight. These interpolymers can have an alpha-olefin content of less than 50 wt %, less than 45 wt %, less than 40 wt %, or less than 35 wt % based on the entire interpolymer weight. Illustrative ethylene/α-olefin interpolymers are ethylene/propylene, ethylene/1-butene, ethylene/1-hexene, ethylene/1-octene, ethylene/diene containing from 20 to 1 wt % dienecomonomeric units, ethylene/propylene/1-octene, ethylene/propylene/1-butene, ethylene/1-butene/1-octene, ethylene/propylene/diene (EPDM) containing 50 to 100 wt % ethylene monomeric units, 49 to >0 wt % of propylene comonomeric units, and 20 to 1 wt % dienecomonomeric units. The diene used to make the dienecomonomeric units in the ethylene/diene copolymer or in EPDM independently may be 1,3-butadiene, 1,5-hexadiene, 1,7-octadiene, ethylidenenorbornene, dicyclopentadiene, vinyl norbornene, or a combination of any two or more thereof.

The ($C_3$-$C_{20}$)alpha-olefin of the ethylene/alpha-olefin copolymer and poly(($C_3$-$C_{20}$)alpha-olefin polymer aspects of (A) polyolefin polymer may be a compound of formula (I): $H_2C=C(H)-R$ (I), wherein R is a straight chain ($C_1$-$C_{18}$)alkyl group. ($C_1$-$C_{18}$)alkyl group is a monovalent unsubstituted saturated hydrocarbon having from 1 to 18 carbon atoms. Examples of R are methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, and octadecyl. In some embodiments the ($C_3$-$C_{20}$) alpha-olefin is 1-propene, 1-butene, 1-hexene, or 1-octene; alternatively 1-butene, 1-hexene, or 1-octene; alternatively 1-butene or 1-hexene; alternatively 1-butene or 1-octene; alternatively 1-hexene or 1-octene; alternatively 1-butene; alternatively 1-hexene; alternatively 1-octene; alternatively a combination of any two of 1-butene, 1-hexene, and 1-octene. Alternatively, the alpha-olefin may have a cyclic structure such as cyclohexane or cyclopentane, resulting in an α-olefin such as 3-cyclohexyl-1-propene (allyl cyclohexane) and vinyl cyclohexane. The ($C_3$-$C_{20}$)alpha-olefin may be used as a comonomer with ethylene monomer.

Alternatively, the (A) polyolefin polymer may be a polyolefin having at least one grafted functional group selected from acrylate, methacrylate, and trialkoxysilyl.

The (A) polyolefin polymer may be a blend or combination of two or more of the foregoing polymers and copolymers.

The (A) polyolefin polymer may be a blend of two or more different polyolefin polymers or a reactor product of polymerization reactions with two or more different catalysts. The (A) polyolefin polymer may be made in two or more reactors, such as ELITE™ polymers from The Dow Chemical Company.

The (A) polyolefin polymer may be made by any suitable process, many of which are well-known in the art. Any conventional or hereafter discovered production process for producing polyolefin polymers may be employed for preparing the (A). Typically the production process comprises one or more polymerization reactions. For example, the LDPE may be prepared using a high pressure polymerization process. Alternatively, the LDPE may be prepared using a coordination polymerization process conducted using one or more polymerization catalysts such as Ziegler-Natta, chromium oxide, metallocene, post-metallocene catalysts. Suitable temperatures are from 0° to 250° C., or 30° or 200° C. Suitable pressures are from atmospheric pressure (101 kPa) to 10,000 atmospheres (approximately 1,013 Mega-Pascals ("MPa")). In most polymerization reactions, the molar ratio of catalyst to polymerizable olefins (monomer/comonomer) employed is from $10^{-12}:1$ to $10^{-1}:1$, or from $10^{-9}:1$ to $10^{-5}:1$.

The amount of the (A) polyolefin polymer in the polyolefin composition may be from 40 to 99.99 wt %, alternatively from 55 to 99.00 wt %, alternatively from 70 to 98 wt %, alternatively from 80 to 97 wt %; all based on the weight of the polyolefin composition.

The constituent (B) monocyclic organosiloxane of formula (I): a molecule containing a single ring substructure composed of silicon and oxygen atoms disposed in an alternating arrangement; and unsaturated organo groups; and optionally H, saturated or aromatic substituent groups; wherein there are at least two unsaturated organo groups and each of at least two silicon atoms in the ring substructure have at least one unsaturated organo group bonded thereto and wherein after accounting for the unsaturated organo groups and oxygen atoms any remaining valences of the silicon atoms are bonded to the H, saturated or aromatic substituent groups; or collection of such molecules. Constituent (B) may be a monocyclic organosiloxane composed of a 6-membered ring (n=3), an 8-membered ring (n=4), a 10-membered ring (n=5), or a 12-membered ring (n=6). The ring substructure is composed of units of formula (I): $[R^1,R^2SiO_{2/2}]_n$(I), wherein subscript n, $R^1$ and $R^2$ are as defined earlier. In each $[R^1,R^2SiO_{2/2}]$ unit, its $R^1$ and $R^2$ groups are bonded to its silicon atom. The units may be designated using conventional organosiloxane shorthand notations simply as $D^{R1,R2}$ such that formula (I) becomes $[D^{R1,R2}]_n$. $R^1$ and $R^2$ may be the same, alternatively different.

In some aspects of the (B) monocyclic organosiloxane of formula (I) $R^1$ is vinyl and $R^2$ is ethyl and (B) is $D^{Vi,Et}$ wherein Vi is vinyl and Et is ethyl; alternatively $R^1$ is allyl and $R^2$ is ethyl and (B) is $D^{Allyl,Et}$; alternatively $R^1$ is butenyl ($H_2C=C(H)CH_2CH_2—$) and $R^2$ is ethyl and (B) is $D^{Butenyl,Et}$. In some aspects $R^1$ is vinyl and $R^2$ is vinyl and (B) is $D^{Vi,Vi}$; alternatively $R^1$ is allyl and $R^2$ is allyl and (B) is $D^{Allyl,Allyl}$; alternatively $R^1$ is butenyl ($H_2C=C(H)CH_2CH_2—$) and $R^2$ is butenyl and (B) is $D^{Butenyl,Butenyl}$. In some aspects $R^1$ is vinyl and $R^2$ is phenyl and (B) is $D^{Vi,Ph}$ wherein Ph is phenyl; alternatively $R^1$ is allyl and $R^2$ is phenyl and (B) is $D^{Allyl,Ph}$; alternatively $R^1$ is butenyl ($H_2C=C(H)CH_2CH_2—$) and $R^2$ is phenyl and (B) is $D^{Butenyl,Ph}$. When $R^2$ is methyl ($CH_3$), the unit may be designated more simply as $D^{R1}$ such that formula (I) becomes $[D^{R1}]_n$. In some aspects $R^1$ is vinyl and $R^2$ is methyl and (B) is $D^{Vi}$; alternatively $R^1$ is allyl and $R^2$ is methyl and (B) is $D^{Allyl}$; alternatively $R^1$ is butenyl ($H_2C=C(H)CH_2CH_2—$) and $R^2$ is methyl and (B) is $D^{Butenyl}$. In some embodiments, (B) is 2,4,6-trimethyl-2,4,6-trivinyl-cyclo-trisiloxane, "$(D^{Vi})_3$" (CAS No. 3901-77-7); 2,4,6,8-tetramethyl-2,4,6,8-tetravinyl-cyclotetrasiloxane, "$(D^{Vi})_4$" (CAS No. 2554-06-5); or a combination thereof.

In some aspects of the (B) monocyclic organosiloxane of formula (I) each $R^1$ is independently $H_2C=C(R^{1a})—C(=O)—O—(CH_2)_m—$ wherein $R^{1a}$ and subscript m are as defined earlier. In some aspects $R^{1a}$ is H, alternatively $R^{1a}$ is methyl. In some aspects subscript m is 1, 2, or 3; alternatively m is 2, 3, or 4; alternatively m is 2 or 3; alternatively m is 1; alternatively m is 2; alternatively m is 3; alternatively m is 4. In some aspects each $R^2$ is independently ($C_1$-$C_2$) alkyl or ($C_2$-$C_3$)alkenyl; alternatively each $R^2$ is independently ($C_1$-$C_2$)alkyl; alternatively each $R^2$ is independently methyl.

The amount of the constituent (B) monocyclic organosiloxane of formula (I) in the polyolefin composition may be from 0.01 to 50 wt %, alternatively from 0.1 to 25 wt %, alternatively from 1.00 to 20 wt %, alternatively from 1.05 to 15 wt %, alternatively from 0.01 to 5 wt %, alternatively from 0.05 to 4.0 wt %, alternatively from 0.1 to 3 wt %, alternatively from 0.10 to 2.0 wt %, alternatively from 0.20 to 1.0 wt %; all based on weight of the polyolefin composition.

The amount of the constituent (B) monocyclic organosiloxane of formula (I) in the polyolefin composition may be a crosslinking effective amount. The term "crosslinking effective amount" means a quantity (wt % described above) that is sufficient under the circumstances to enable crosslinking polyolefin macromolecules via multivalent crosslinker groups derived from (B). The circumstances may include loading level (wt %) of (B), loading level (wt %) of (C) organic peroxide. A crosslinking effective amount of (B) monocyclic organosiloxane of formula (I) gives a greater extent of crosslinking, at a particular loading level (wt %) of (C) organic peroxide, than a comparative composition that is free of the (B) monocyclic organosiloxane of formula (I). The circumstances may also depend on the total amount, if any, of any optional additive, such as (E) antioxidant, (F) filler and/or (G) flame retardant, present in the polyolefin composition. To determine a crosslinking effective amount for a particular embodiment of the polyolefin composition, the quantity of the (B) monocyclic organosiloxane of formula (I) in the polyolefin composition initially may be less than the crosslinking effective amount. Thereafter, the quantity of (B) is increased by increments (e.g., doubling with each increase) until a crosslinking effect amount under the circumstances is reached.

The crosslinking effective amount of the constituent (B) monocyclic organosiloxane of formula (I) in the polyolefin composition may be from 0.01 to 50 wt %, alternatively from 0.1 to 25 wt %, alternatively from 1.00 to 20 wt %, alternatively from 1.05 to 15 wt %, alternatively from 0.01 to 5 wt %, alternatively from 0.050 to 4.0 wt %, alternatively from 0.10 to 2.0 wt %, alternatively from 0.20 to 1.0 wt %; all based on the weight of the filler-free polyolefin composition. The crosslinking effective amount of the constituent (B) monocyclic organosiloxane of formula (I) in the polyolefin composition may vary depending upon the circumstances described above. For example, the crosslinking effective amount of (B) may be higher in embodiments of the polyolefin composition that contain (F) filler than in embodiments of the polyolefin composition that are free of (F) filler.

Regarding determining the crosslinking effective amount of the constituent (B), the presence of crosslinking may be detected by an increase in torque using a moving die rheometer (MDR). In some aspects the presence of crosslinking may be detected as a percentage solvent extraction (Ext %). Ext %=W1/Wo*100%, wherein W1 is the weight after extraction, Wo is original weight before extraction, / indicates division, and * indicates multiplication. The absence of, or a reduced level of, the carbon-carbon double bond of the unsaturated organo group (e.g., $R^1$) of (B) in the crosslinked polyolefin product (due to a coupling with the (A) polyolefin polymer) may be detected by carbon-13 or silicon-29 nuclear magnetic resonance ($^{13}$C-NMR spectroscopy and/or $^{29}$Si-NMR) spectroscopy.

The constituent (C) organic peroxide: a molecule containing carbon atoms, hydrogen atoms, and two or more oxygen atoms, and having at least one —O—O— group, with the proviso that when there are more than one —O—O— group, each —O—O— group is bonded indirectly to another —O—O— group via one or more carbon atoms, or collection of such molecules. The (C) organic peroxide may be added to the polyolefin composition for curing comprising heating the polyolefin composition comprising constituents (A), (B), and (C) to a temperature at or above the (C) organic peroxide's decomposition temperature. The (C) organic peroxide may be a monoperoxide of formula $R^O—O—O—R^O$, wherein each $R^O$ independently is a ($C_1$-$C_{20}$) alkyl group or ($C_6$-$C_{20}$)aryl group. Each ($C_1$-$C_{20}$)alkyl group independently is unsubstituted or substituted with 1 or 2 ($C_6$-$C_{12}$)aryl groups. Each ($C_6$-$C_{20}$)aryl group is unsubstituted or substituted with 1 to 4 ($C_1$-$C_{10}$)alkyl groups. Alternatively, the (C) may be a diperoxide of formula $R^O—O—O—R—O—O—R^O$, wherein R is a divalent hydrocarbon group such as a ($C_2$-$C_{10}$)alkylene, ($C_3$-$C_{10}$) cycloalkylene, or phenylene, and each $R^O$ is as defined above. The (C) organic peroxide may be bis(1,1-dimethylethyl) peroxide; bis(1,1-dimethylpropyl) peroxide; 2,5-dimethyl-2,5-bis(1,1-dimethylethylperoxy) hexane; 2,5-dimethyl-2,5-bis(1,1-dimethylethylperoxy) hexyne; 4,4-bis(1,1-dimethylethylperoxy) valeric acid; butyl ester; 1,1-bis(1,1-dimethylethylperoxy)-3,3,5-trimethylcyclohexane; benzoyl peroxide; tert-butyl peroxybenzoate; di-tert-amyl peroxide ("DTAP"); bis(alpha-t-butyl-peroxyisopropyl) benzene ("BIPB"); isopropylcumyl t-butyl peroxide; t-butylcumylperoxide; di-t-butyl peroxide; 2,5-bis(t-butylperoxy)-2,5-dimethylhexane; 2,5-bis(t-butylperoxy)-2,5-dimethylhexyne-3,1,1-bis(t-butylperoxy)-3,3,5-trimethylcyclohexane; isopropylcumylcumylperoxide; butyl 4,4-di(tert-butylperoxy) valerate; or di(isopropylcumyl) peroxide; or dicumyl peroxide. The (C) organic peroxide may be dicumyl peroxide. In some aspects only a blend of two or more (C) organic peroxides is used, e.g., a 20:80 (wt/wt) blend of t-butyl cumyl peroxide and bis(t-butyl peroxy isopropyl)benzene (e.g., LUPEROX D446B, which is commercially available from Arkema). In some aspects at least one, alternatively each (C) organic peroxide contains one —O—O— group. The (C) organic peroxide may be 0.01 to 4.5 wt %, alternatively 0.05 to 2 wt %, alternatively 0.10 to 2.0 wt %, alternatively 0.2 to 0.8 wt % of the polyolefin composition.

The optional constituent (D) conventional coagent: a molecule that contains a backbone or ring substructure and one, alternatively two or more propenyl, acrylate, and/or vinyl groups bonded thereto, wherein the substructure is composed of carbon atoms and optionally nitrogen atoms, or a collection of such molecules. The (D) conventional coagent is free of silicon atoms. The (D) conventional coagent may be a propenyl-functional conventional coagent as described by any one of limitations (i) to (v): (i) (D) is 2-allylphenyl allyl ether; 4-isopropenyl-2,6-dimethylphenyl allyl ether; 2,6-dimethyl-4-allylphenyl allyl ether; 2-methoxy-4-allylphenyl allyl ether; 2,2'-diallyl bisphenol A; O,O'-diallylbisphenol A; or tetramethyldiallylbisphenol A; (ii) (D) is 2,4-diphenyl-4-methyl-1-pentene or 1,3-diisopropenylbenzene; (iii) (D) is triallylisocyanurate ("TAIC"); triallylcyanurate ("TAC"); triallytrimellitate ("TATM"); N,N,N',N',N'',N''-hexaallyl-1,3,5-triazine-2,4,6-triamine ("HATATA"; also known as $N^2,N^2,N^4,N^4,N^6,N^6$-hexaallyl-1,3,5-triazine-2,4,6-triamine); triallylorthoformate; pentaerythritoltriallyl ether; triallyl citrate; or triallylaconitate; (iv) (D) is a mixture of any two of the propenyl-functional coagents in (i). Alternatively, the (D) may be an acrylate-functional conventional coagent selected from trimethylolpropanetriacrylate ("TMPTA"), trimethylolpropanetrimethylacrylate ("TMPTMA"), ethoxylatedbisphenol A dimethacrylate, 1,6-hexanediol diacrylate, pentaerythritoltetraacrylate, dipentaerythritolpentaacrylate, tris(2-hydroxyethyl) isocyanuratetriacrylate, and propoxylatedglyceryttriacrylate. Alternatively, the (D) may be a vinyl-functional conventional coagent selected from polybutadiene having at least 50 wt % 1,2-vinyl content and trivinyl cyclohexane ("TVCH"). Alternatively, the (D) may be a conventional coagent described in U.S. Pat. Nos. 5,346,961 or 4,018,852. Alternatively, the (D) may be a combination or any two or more of the foregoing conventional coagents. In some aspects the polyolefin composition and crosslinked polyolefin product is free of (D). When present, the (D) conventional coagent may be 0.01 to 4.5 wt %, alternatively 0.05 to 2 wt %, alternatively 0.1 to 1 wt %, alternatively 0.2 to 0.5 wt % of the polyolefin composition.

The optional constituent (E) antioxidant: an organic molecule that inhibits oxidation, or a collection of such molecules. The (E) antioxidant functions to provide antioxidizing properties to the polyolefin composition and/or crosslinked polyolefin product. Examples of suitable (E) are bis(4-(1-methyl-1-phenylethyl)phenyl)amine (e.g., NAUGARD 445); 2,2-methylene-bis(4-methyl-6-t-butylphenol) (e.g., VANOX MBPC); 2,2'-thiobis(2-t-butyl-5-methylphenol (CAS No. 90-66-4; 4,4'-thiobis(2-t-butyl-5-methylphenol) (also known as 4,4'-thiobis(6-tert-butyl-m-cresol), CAS No. 96-69-5, commercially LOWINOX TBM-6); 2,2'-thiobis(6-t-butyl-4-methylphenol (CAS No. 90-66-4, commercially LOWINOX TBP-6); tris[(4-tert-butyl-3-hydroxy-2,6-dimethylphenyl)methyl]-1,3,5-triazine-2,4,6-trione (e.g., CYANOX 1790); pentaerythritol tetrakis(3-(3,5-bis(1,1-dimethylethyl)-4-hydroxyphenyl)propionate (e.g., IRGANOX 1010, CAS Number 6683-19-8); 3,5-bis(1,1-dimethylethyl)-4-hydroxybenzenepropanoic acid 2,2'-thiodiethanediyl ester (e.g., IRGANOX 1035, CAS Number 41484-35-9); distearylthiodipropionate ("DSTDP"); dilaurylthiodipropionate (e.g., IRGANOX PS 800); stearyl 3-(3,5-di-t-butyl-4-hydroxyphenyl)propionate (e.g., IRGANOX 1076); 2,4-bis(dodecylthiomethyl)-6-methylphenol (IRGANOX 1726); 4,6-bis(octylthiomethyl)-o-cresol (e.g. IRGANOX 1520); and 2',3-bis[[3-[3,5-di-tert-butyl-4-hydroxyphenyl]propionyl]]propionohydrazide (IRGANOX 1024). In some aspects (E) is 4,4'-thiobis(2-t-butyl-5-methylphenol) (also known as 4,4'-thiobis(6-tert-butyl-m-cresol); 2,2'-thiobis(6-t-butyl-4-methylphenol; tris[(4-tert-butyl-3-hydroxy-2,6-dimethylphenyl)methyl]-1,3,5-triazine-2,4,6-trione; distearylthiodipropionate; or dilaurylthiodipropionate; or a combination of any two or more thereof. The combination may be tris[(4-tert-butyl-3-hydroxy-2,6-dimethylphenyl)methyl]-1,3,5-triazine-2,4,6-trione and distearylthiodipropionate. In some aspects the polyolefin composition and crosslinked polyolefin product is free of (E). When present, the (E) antioxidant may be from 0.01 to 1.5 wt %, alternatively 0.05 to 1.2 wt %, alternatively 0.1 to 1.0 wt % of the polyolefin composition.

The optional constituent (F) filler: a finely-divided particulate solid or gel that occupies space in, and optionally affects function of, a host material. The (F) filler may be a calcined clay, an organoclays, or a hydrophobized fumed silica such as those commercially available under the CAB-O-SIL trade name from Cabot Corporation. The (F) filler may have flame retarding effects. In some aspects the polyolefin composition and crosslinked polyolefin product is free of (F). When present, the (F) filler may be 1 to 40 wt %, alternatively 2 to 30 wt %, alternatively 5 to 20 wt % of the polyolefin composition.

In regard to (F) filler, in some aspects the polyolefin composition does not contain 20 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof. In some aspects the polyolefin composition does not contain 20 wt % or more of, alternatively does not contain 15 wt % or more of, alternatively does not contain 10 wt % or more of, alternatively is free of any inorganic filler selected from the group consisting of: solids containing Al, solids containing Ca, solids containing Mg, solids containing Si, solids containing Ti, and mixtures thereof. In some aspects the polyolefin composition is free of a silsesquioxane, alternatively any siloxane except constituent (B). In some aspects the polyolefin composition is free of a silsesquioxane and any one of the above-mentioned groups of inorganic fillers. For avoidance of doubt, the term "inorganic filler" does not include carbon black.

The optional constituent (G) flame retardant: a molecule or substance that inhibits combustion, or a collection of such molecules. The (G) may be a halogenated or halogen-free compound. Examples of (G) halogenated (G) flame retardants are organochlorides and organobromides, Examples of the organochlorides are chlorendic acid derivatives and chlorinated paraffins. Examples of the organobromides are decabromodiphenyl ether, decabromodiphenyl ethane, polymeric brominated compounds such as brominated polystyrenes, brominated carbonate oligomers, brominated epoxy oligomers, tetrabromophthalic anhydride, tetrabromobisphenol A and hexabromocyclododecane. Typically, the halogenated (G) flame retardants are used in conjunction with a synergist to enhance their efficiency. The synergist may be antimony trioxide. Examples of the halogen-free (G) flame retardant are inorganic minerals, organic nitrogen intumescent compounds, and phosphorus based intumescent compounds. Examples of the inorganic minerals are aluminum hydroxide and magnesium hydroxide. Examples of the phosphorous-based intumescent compounds are organic phosphonic acids, phosphonates, phosphinates, phosphonites, phosphinites, phosphine oxides, phosphines, phosphites, phosphates, phosphonitrilic chloride, phosphorus ester amides, phosphoric acid amides, phosphonic acid amides, phosphinic acid amides, melamine and melamine derivatives thereof, including melamine polyphosphate, melamine pyrophosphate and melamine cyanurate, and mixtures of two or more of these materials. Examples include phenylbisdodecyl phosphate, phenylbisneopentylphosphate, phenyl ethylene hydrogen phosphate, phenyl-bis-3,5,5' trimethylhexyl phosphate), ethyldiphenyl phosphate, 2 ethylhexyl di(p-tolyl) phosphate, diphenyl hydrogen phosphate, bis(2-ethyl-hexyl) para-tolylphosphate, tritolyl phosphate, bis(2-ethylhexyl)-phenyl phosphate, tri(nonylphenyl) phosphate, phenylmethyl hydrogen phosphate, di(dodecyl) p-tolyl phosphate, tricresyl phosphate, triphenyl phosphate, triphenyl phosphate, dibutylphenyl phosphate, 2-chloroethyldiphenyl phosphate, p-tolylbis(2,5,5'-trimethylhexyl) phosphate, 2-ethylhexyldiphenyl phosphate, and diphenyl hydrogen phosphate. Phosphoric acid esters of the type described in U.S. Pat. No. 6,404,971 are examples of phosphorus-based flame retardants. Additional examples include liquid phosphates such as bisphenol A diphosphate (BAPP) (AdekaPalmarole) and/or resorcinol bis(diphenyl phosphate) (Fyroflex RDP) (Supresta, ICI), solid phosphorus such as ammonium polyphosphate (APP), piperazine pyrophosphate and piperazine polyphosphate. Ammonium polyphosphate is often used with flame retardant co-additives, such as melamine derivatives. Also useful is Melafine (DSM) (2,4,6-triamino-1,3,5-triazine; fine grind melamine). In some aspects the polyolefin composition and crosslinked polyolefin product is free of (G). When present, the (G) may be in a concentration of from 0.01 to 70 wt %, alternatively 0.05 to 40 wt %, alternatively 1 to 20 wt % of the polyolefin composition.

The optional constituent (H) hindered amine stabilizer: a molecule that contains a basic nitrogen atom that is bonded to at least one sterically bulky organo group and functions as an inhibitor of degradation or decomposition, or a collection of such molecules. The (H) is a compound that has a sterically hindered amino functional group and inhibits oxidative degradation and can also increase the shelf lives of embodiments of the polyolefin composition that contain (C) organic peroxide. Examples of suitable (H) are butanedioic acid dimethyl ester, polymer with 4-hydroxy-2,2,6,6-tetramethyl-1-piperidine-ethanol (CAS No. 65447-77-0, commercially LOWILITE 62); and N,N-bisformyl-N,N'-bis(2,2,6,6-tetramethyl-4-piperidinyl)-hexamethylenediamine (CAS No. 124172-53-8, commercially Uvinul 4050 H). In some aspects the polyolefin composition and crosslinked polyolefin product is free of (H). When present, the (H) hindered amine stabilizer may be from 0.001 to 1.5 wt %, alternatively 0.002 to 1.2 wt %, alternatively 0.002 to 1.0 wt %, alternatively 0.005 to 0.5 wt %, alternatively 0.01 to 0.2 wt %, alternatively 0.05 to 0.1 wt % of the polyolefin composition.

The optional constituent (I) tree retardant: a molecule that inhibits water and/or electrical treeing, or a collection of such molecules. The tree retardant may be a water tree retardant or electrical tree retardant. The water tree retardant is a compound that inhibits water treeing, which is a process by which polyolefins degrade when exposed to the combined effects of an electric field and humidity or moisture. The electrical tree retardant, also called a voltage stabilizer, is a compound that inhibits electrical treeing, which is an electrical pre-breakdown process in solid electrical insulation due to partial electrical discharges. Electrical treeing can occur in the absence of water. Water treeing and electrical treeing are problems for electrical cables that contain a coated conductor wherein the coating contains a polyolefin. The (I) may be a poly(ethylene glycol) (PEG). In some aspects the polyolefin composition and crosslinked polyolefin product is free of (I). When present, the (I) tree retardant may be from 0.01 to 1.5 wt %, alternatively 0.05 to 1.2 wt %, alternatively 0.1 to 1.0 wt % of the polyolefin composition.

The optional constituent (J) methyl radical scavenger: a molecule that is reactive with methyradicals, or a collection of such molecules. The (J) react with methyl radicals in the polyolefin composition or crosslinked polyolefin product. The (J) may be a "TEMPO" derivative of 2,2,6,6-tetramethyl-1-piperidinyl-N-oxyl or a 1,1-diarylethylene. Examples of TEMPO derivatives are 4-acryloxy-2,2,6,6-tetramethyl-1-piperidinyl-N-oxyl (CAS No. 21270-85-9, "acrylate TEMPO"), 4-allyloxy-2,2,6,6-tetramethyl-1-piperidinyl-N-oxyl (CAS No. 217496-13-4, "allyl TEMPO"); bis(2,2,6,6-tetramethyl-1-piperidinyl-N-oxyl) sebacate (CAS No. 2516-92-9, "bis TEMPO")); N,N-bis(acryloyl-4-amino)-2,2,6,6-tetramethyl-1-piperidinyl-N-oxyl (CAS No. 1692896-32-4, "diacrylamide TEMPO"); and N-acryloyl-4-amino-2,2,6,6-tetramethyl-1-piperidinyl-N-oxyl (CAS No. 21270-88-2, "monoacrylamide TEMPO"). Examples of 1,1-diarylethylenes are 1,1-diphenylethylene and alpha-methylstyrene. In some aspects the polyolefin composition and crosslinked polyolefin product is free of (J). When present, the (J) methyl radical scavenger may be from 0.01 to 1.5 wt %, alternatively 0.05 to 1.2 wt %, alternatively 0.1 to 1.0 wt % of the polyolefin composition.

The optional constituent (K) scorch retardant: a molecule that inhibits premature curing, or a collection of such molecules. Examples of a scorch retardant are hindered phenols; semi-hindered phenols; TEMPO; TEMPO derivatives; 1,1-diphenylethylene; 2,4-diphenyl-4-methyl-1-pentene (also known as alpha-methyl styrene dimer or AMSD); and allyl-containing compounds described in U.S. Pat. No. 6,277,925B1, column 2, line 62, to column 3, line 46. In some aspects the polyolefin composition and crosslinked polyolefin product is free of (K). When present, the (K) scorch retardant may be from 0.01 to 1.5 wt %, alternatively 0.05 to 1.2 wt %, alternatively 0.1 to 1.0 wt % of the polyolefin composition.

The optional constituent (L) nucleating agent an organic or inorganic additive that that enhances the rate of crystallization of a polyolefin polymer. Examples of (L) are calcium carbonate, titanium dioxide, barium sulfate, ultra high-molecular-weight polyethylene, potassium hydrogen phthalate, benzoic acid compounds, sodium benzoate compounds, disodium bicyclo[2.2.1]heptane-2,3-dicarboxylate, zinc monoglycerolate, and 1,2-cydohexanedicarboxylic acid, calcium salt:zinc stearate. In some aspects the polyolefin composition and crosslinked polyolefin product is free of (L). When present, the (L) may be in a concentration of from 0.01 to 1.5 wt %, alternatively 0.05 to 1.2 wt %, alternatively 0.1 to 1.0 wt % of the polyolefin composition.

The optional constituent (M) carbon black: a finely-divided form of paracrystalline carbon having a high surface area-to-volume ratio, but lower than that of activated carbon. Examples of (M) are furnace carbon black, acetylene carbon black, conductive carbons (e.g., carbon fibers, carbon nanotubes, graphene, graphites, and expanded graphite platelets). In some aspects the polyolefin composition and crosslinked polyolefin product is free of (M). When present, the (M) may be in a concentration of from 0.01 to 40 wt %, alternatively 0.05 to 35 wt %, alternatively 0.1 to 20 wt %, alternatively 0.5 to 10 wt %, alternatively 1 to 5 wt %, of the polyolefin composition.

In addition the polyolefin composition may independently further comprise 0.001 to 50 wt %, alternatively 0.05 to 30 wt %, alternatively 0.1 to 20 wt %, alternatively 0.5 to 10 wt %, alternatively 1 to 5 wt % of each of one or more optional additives selected from a carrier resin, lubricant, processing aid, slip agent, plasticizer, surfactant, extender oil, acid scavenger, and metal deactivator. E.g., the extender oil may be as high as 50 wt % of the polyolefin composition. In some aspects the polyolefin composition and crosslinked polyolefin product is free of any one of the immediately foregoing additives.

The foregoing constituents of the polyolefin composition are not believed to function as ring opening catalysts for cyclic siloxanes therein. If, however, any one or more of the foregoing constituents of the polyolefin composition should unexpectedly be found to function as ring opening catalyst(s) for cyclic siloxanes, such constituent(s) would be excluded from the polyolefin composition.

The crosslinked polyolefin product: a reaction product that contains networked polyolefinic resins that contain C—C bond crosslinks formed during curing (crosslinking) of the polyolefin composition. The networked polyolefinic resins may comprise reaction products of coupling macromolecules of the (A) polyolefin polymer with molecules of the (B) monocyclic organosiloxane of formula (I) to give a network structure containing a multivalent monocyclic organosiloxane crosslinker group that is bonded to two or more macromolecules from the (A) polyolefin polymer via a reaction of the two or more macromolecules of (A) polyolefin polymer with one or more $R^1$ groups of the molecule of (B) monocyclic organosiloxane of formula (I). In some aspects two macromolecules of (A) may be added across the same carbon-carbon double bond of the one $R^1$. For example, when two or more $R^1$ is vinyl and zero, one or more $R^2$ is vinyl, the network structure of the crosslinked polyolefin product may contain two or more multivalent monocyclic organosiloxane crosslinker groups of formula (II): [—$CH_2CH_2(R^2)SiO_{2/2}$](II) and/or formula (III) [$CH_3C$(—)(H),($R^2$)$SiO_{2/2}$] (III) and n-2 or fewer (e.g., n-3) unreacted units, if any, of formula (I), wherein subscript n is as defined for formula (I) and "-" indicates one of the multivalencies. When each $R^2$ is independently H, ($C_1$-$C_4$)alkyl, or phenyl in formula (I), each $R^2$ in formulas (II) and (III) independently is H, ($C_1$-$C_4$)alkyl, or phenyl.

The crosslinked polyolefin product may also contain by-products of curing such as alcohol and ketone by-products of the reaction of the (C) organic peroxide. When the polyolefin composition further contains one or more of any optional additives or constituents such as (E) antioxidant, the crosslinked polyolefin product may also contain the any one or more of the optional additives or constituents such as (E), or one or more reaction products formed therefrom during the curing of the polyolefin composition. The crosslinked polyolefin product may be in a divided solid form or in continuous form. The divided solid form may comprise granules, pellets, powder, or a combination of any two or more thereof. The continuous form may be a molded part (e.g., injection molded part) or an extruded part (e.g., a coated conductor or a cable).

The crosslinked polyolefin product may be free of a ring opening catalyst and/or of siloxane polymer molecules (silicones, prepared by ring-opening polymerization of (B)).

The coated conductor. The coated conductor may be an insulated electrical conductor. The insulated electrical conductor may be a coated metal wire or an electrical cable, including a power cable for use in low voltage ("LV", >0 to <5 kilovolts (kV)), medium voltage ("MV", 5 to <69 kV), high voltage ("HV", 69 to 230 kV) or extra-high voltage ("EHV", >230 kV) data transmitting and electricity-transmitting/distributing applications. A "wire" means a single strand or filament of conductive material, e.g., conductive metal such as copper or aluminum. A "cable" and "power cable" are synonymous and mean an insulated electrical conductor comprising at least one wire disposed within a covering that may be referred to as a sheath, jacket (protective outer jacket), or coating. The insulated electrical conductor may be designed and constructed for use in medium, high, or extra-high voltage applications. Examples of suitable cable designs are shown in U.S. Pat. Nos. 5,246,783; 6,496,629; and 6,714,707.

The insulated electrical conductor may contain a conductor/transmitter core and an outer single layer covering or an outer multilayer covering disposed therearound so as to protect and insulate the conductor/transmitter core from external environments. The conductor/transmitter core may be composed of one or more metal wires. When the conductor/transmitter core contains two or more metal wires, the metal wires may be sub-divided into discrete wire bundles. Each wire in the conductor/transmitter core, whether bundled or not, may be individually coated with an insulation layer and/or the discrete bundles may be coated with an insulation layer. The single layer covering or multilayer covering (e.g., a single layer or multilayer coating or sheath) primarily functions to protect or insulate the conductor/transmitter core from external environments such as sunlight, water, heat, oxygen, other conductive materials (e.g., to prevent short-circuiting), and/or other corrosive materials (e.g., chemical fumes).

The single layer or multilayer covering from one insulated electrical conductor to the next may be configured differently depending upon their respective intended uses. For example, viewed in cross-section, the multilayer covering of the insulated electrical conductor may be configured sequentially from its innermost layer to its outermost layer with the following components: an inner semiconducting layer, a crosslinked polyolefin insulation layer comprising the crosslinked polyolefin product (inventive crosslinked product), an outer semiconducting layer, a metal shield, and a protective sheath. The layers and sheath are circumferentially and coaxially (longitudinally) continuous. The metal shield (ground) is coaxially continuous, and circumferentially either continuous (a layer) or discontinuous (tape or wire). Depending on the intended application the multilayer covering for the insulated optical fiber may omit the semiconducting layers and/or the metal shield. The outer semiconducting layer, when present, may be composed of a peroxide-crosslinked semiconducting product that is either bonded or strippable from the crosslinked polyolefin layer.

In some aspects is a method of making the coated conductor, the method comprising extruding a coating comprising a layer of the polyolefin composition onto a conductor/transmitter core to give a coated core, and passing coated core through a continuous vulcanization (CV) apparatus configured with suitable CV conditions for curing the polyolefin composition to give the coated conductor. CV conditions include temperature, atmosphere (e.g., nitrogen gas), and line speed or passage time period through the CV apparatus. Suitable CV conditions may give a coated conductor exiting the CV apparatus, wherein the coated conductor contains a crosslinked polyolefin layer formed by curing the layer of the crosslinked polyolefin layer.

The method of conducting electricity. The inventive method of conducting electricity may use the inventive coated conductor that comprises the insulated electrical conductor embodiment. Also contemplated is a method of transmitting data using the inventive coated conductor that comprises the insulated electrical conductor.

Density is measured according to ASTM D792-13, *Standard Test Methods for Density and Specific Gravity (Relative Density) of Plastics by Displacement*, Method B (for testing solid plastics in liquids other than water, e.g., in liquid 2-propanol). Report results in units of grams per cubic centimeter (g/cm$^3$ or g/cc).

Melt index ($I_2$) is measured according to ASTM D1238-04 (190° C., 2.16 kg), *Standard Test Method for Melt Flow Rates of Thermoplastics by Extrusion Platometer*, using conditions of 190° C./2.16 kilograms (kg), formerly known as "Condition E" and also known as $I_2$. Report results in units of grams eluted per 10 minutes (g/10 min.) or the equivalent in decigrams per 1.0 minute (dg/1 min.). 10.0 dg=1.00 g.

Migration Measurement Test Method. The migration additives could be observed by putting 5 grams (g) pellets into an unused transparent, self-sealing polyethylene bag and pressing the pellets 5 times to see any marks (oil traces) become stamped on the bag. If marks are observed record "yes" and if there are no observed marks record "no".

Scorch Time Test Method. Scorch time or time to scorch (ts1) of a sample "X" is measured by MDR at 140° C. and abbreviated ts1@140° C. Scorch time is measured on an Alpha Technologies Rheometer MDR 2000E according to ISO 6502 as follows. Put 5 to 6 g of test material (pellets) into the MDR 200E instrument. Torque is measured for oscillatory deformation of 0.5 degree arc at 100 cycles per minute (cpm) as a function of time from 0 (start) to 120 minutes at 140° C., and torque curve versus time is plotted. The ts1 is the length of time it takes from the start of the test (0 minute) to observe an increase of 1 deciNewton-meter (dNm) in torque from the minimum value in the torque curve. Use the ts1@140° C. to characterize scorch resistance during melt processing processes (e.g., melt compounding or extrusion).

T90 Crosslinking Time Test Method: ASTM D5289-12, *Standard Test Method for Rubber Property-Vulcanization Using Rotorless Cure Meters*. Measure torque of a test sample using the following procedure. Heat test sample in a moving die rheometer (MDR) instrument MDR2000 (Alpha Technologies) at 180° C. for 20 minutes while monitoring change in torque for oscillatory deformation of 0.5 degree arc at 100 cpm. Designate the lowest measured torque value as "ML", expressed in deciNewton-meter (dN-m). As curing or crosslinking progresses, the measured torque value increases, eventually reaching a maximum torque value. Designate the maximum or highest measured torque value as "MH", expressed in dN-m. All other things being equal, the greater the MH torque value, the greater the extent of crosslinking. Determine the T90 crosslinking time as being the number of minutes required to achieve a torque value equal to 90% of the difference MH minus ML (MH-ML), i.e., 90% of the way from ML to MH. The shorter the T90 crosslinking time, i.e., the sooner the torque value gets 90% of the way from ML to MH, the faster the curing rate of the test sample. Conversely, the longer the T90 crosslinking time, i.e., the more time the torque value takes to get 90% of the way from ML to MH, the slower the curing rate of the test sample.

The following data are predictive of how the inventive compositions would perform when extruded and crosslinked (e.g., in a CV apparatus) to form an insulation layer of a cable.

EXAMPLES

LDPE (A1): a low density polyethylene (LDPE) is prepared by compounding LDPE (A2) with 0.12 wt % Antioxidant (E1), 0.24 wt % Antioxidant (E2), and 50 parts per million (wt) Hindered amine stabilizer (H1) (see below for descriptions of (A2), (E1), (E2), and (H1)), and which has a density of 0.92 g/cm$^3$, and a melt index ($I_2$) of 2 g/10 min.

LDPE (A2): a high pressure reactor made, low density polyethylene (LDPE) product, which has an average of greater than 0.3 carbon-carbon double bonds per 1,000 carbon atoms, a density of 0.92 g/cm$^3$, and a melt index ($I_2$) of 2 g/10 min. (190° C., 2.16 kg) and is obtained from The Dow Chemical Company, Midland, Mich., USA. The LDPE (A2) is made in a tubular high pressure reactor and process of the type described in *Introduction to Polymer Chemistry*, Stille, Wiley and Sons, New York, 1962, pages 149 to 151. The process is free radical initiated and is conducted at a pressure from 170 to 310 megapascals (MPa, i.e., 25,000 to 45,000 pounds per square inch (psi)) and a temperature from 200° to 350° C.

LDPE (A3): a low density polyethylene (LDPE) is prepared by Brabender single screw extruder at 120° C. to blend a known quantity of LDPE (A2) into LDPE (A1) to give LDPE (A3) having a loading of 0.06 wt % Antioxidant (E1), 0.09 wt % Antioxidant (E2), and 19 ppm of Hindered amine stabilizer (H1), and which has a density of 2.0 g/cm$^3$ and a melt index ($I_2$) of 0.92 g/10 min.

Monocyclic organosiloxane (B1): 2,4,6-trimethyl-2,4,6-trivinyl-cyclotrisiloxane, "(D$^{Vi}$)$_3$," (CAS No. 3901-77-7) obtained from Gelest.

Monocyclic organosiloxane (B2): 2,4,6,8-tetramethyl-2,4,6,8-tetravinyl-cyclotetrasiloxane, "(D$^{Vi}$)$_4$" (CAS No. 2554-06-5) obtained from The Dow Chemical Company.

Monocyclic organosiloxane (B3): 2,4,6,8,10-pentamethyl-2,4,6,8,10-pentavinyl-cyclopentasiloxane, "(D$^{Vi}$)$_5$" (CAS No. 17704-22-2) obtained from Gelest.

Organic peroxide (C1): dicumyl peroxide ("DCP") obtained from Fangruida.

Conventional Coagent (D1): triallylisocyanurate (TAIC) obtained from Fangruida, People's Republic of China.

Antioxidant (E1): Cyanox 1790, which is available from Cytec Industries Inc.

Antioxidant (E2): DSTDP, which is available from Reagens, Inc.

Hindered Amine Stabilizer (H1): Uvinul 4050 from BASF.

Octavinyl polyhedral oligomericsilsesquioxane (OV-POSS): To a 500 mL three-necked flask was added anhydrous methanol (200 mL), deionized water (9 mL), and concentrated hydrochloric acid (36 wt %, 2 mL). The resulting first mixture was stirred at 40° C. for about 10 minutes. To the first mixture was then added dropwise over 4 hours a solution of vinyltrimethoxysilane (20 mL, $H_2C\!=\!C(H)Si(OCH_3)_3$) in methanol (50 mL). An additional portion of methanol (30 mL) was added all at once after the addition of the vinyltrimethoxysilane solution was completed. The resulting combined mixture was stirred for 5 days at 40° C. A precipitate of OV-POSS formed and was filtered off. The resulting filter cake was dissolved in a minimum amount of tetrahydrofuran, and to the resulting solution was added ethanol to reprecipitate the OV-POSS. The reprecipitated OV-POSS was filtered and dried under reduced pressure to give 1 g (11% yield) of OV-POSS as a white solid.

Phosphazene base ("P4-t-Bu"): a 0.4 Molar solution of 1-tert-butyl-4,4,4-tris(dimethylamino)-2,2-bis[tris(dimethylamino)phosphoranylidenamino]-$2^5,4^5$-catenadi(phosphazene) in hexane obtained from Sigma-Aldrich.

Comparative Examples 1 and 2 (CE1 & CE2): in separate runs add OV-POSS into a melt of LDPE (A3) at 120° C. for 5 minutes at 40 rotations per minute (rpm) in a Brabender internal mixer to give an intermediate composition. Then press the intermediate composition at 120° C. for 2 minutes to form a plaque. Cut the plaque into pellets, and soak the pellets with organic peroxide (C1) at 80° C. for 6 hours to give CE1 and CE2. See Tables 1 and 3.

Comparative Examples 3 and 4 (CE3 and CE4): In separate runs, melt LDPE (A2) in a HAAKE internal mixture at 120° C. for 5 minutes at 50 rotations per minute (rpm). Then add Monocyclic organosiloxane (B3) and phosphazene base P4-t-Bu (different amounts), and mix the resulting combination 30 seconds. Then add organic peroxide (C1), and mix the resulting combination for 30 seconds to give an intermediate composition. Press the intermediate composition at 120° C. under 10 megapascals (MPa) pressure for 30 seconds to give CE3 and C4, respectively as plaques. See Tables 1 and 3.

Comparative Examples 5 and 6: soak LDPE (A3) pellets with organic peroxide (C1) at 80° C. for 6 hours to give compositions CE5 and CE6. See Tables 1 and 3.

TABLE 1 compositions of CE1 to CE6. (0 = 0.00)

| Constituent (weight parts) | CE1 | CE2 | CE3 | CE4 | CE5 | CE6 |
|---|---|---|---|---|---|---|
| LDPE (A3) | 98.40 | 98.55 | 0 | 0 | 98.65 | 98.85 |
| LDPE (A2) | 0 | 0 | 98.20 | 97.80 | 0 | 0 |
| Dicumyl Peroxide (C1) | 0.50 | 0.50 | 0.50 | 0.50 | 1.35 | 1.15 |
| OV-POSS | 1.10 | 0.50 | 0 | 0 | 0 | 0 |
| P4-t-Bu | 0 | 0 | 0.10 | 0.50 | 0 | 0 |
| (B1) = $(D^{Vi})_3$ | 0 | 0 | 0 | 0 | 0 | 0 |
| (B2) = $(D^{Vi})_4$ | 0 | 0 | 0 | 0 | 0 | 0 |
| (B3) = $(D^{Vi})_5$ | 0 | 0 | 1.20 | 1.20 | 0 | 0 |
| TAIC (D1) | 0 | 0.45 | 0 | 0 | 0 | 0 |
| Total | 100.00 | 100.00 | 100.00 | 100.00 | 100.00 | 100.00 |
| Vinyl content (mmol) | 13.9 | 12.4 | 13.9 | 13.9 | 0 | 0 |

Inventive Examples 1 to 6 (IE1 to IE6): In separate runs, soak Monocyclic organosiloxane (B1), (B2) or (B3), and optionally triallylisocyanurate (TAIC), and organic peroxide (C1) into pellets of LDPE (A3) or (A2) at 80° C. for 6 hours in an oven to give inventive compositions IE1 to IE6 in pellets form. See Tables 2 and 4.

TABLE 2 compositions of IE1 to IE6. (0 = 0.00)

| Constituent (weight parts) | IE1 | IE2 | IE3 | IE4 | IE5 | IE6 |
|---|---|---|---|---|---|---|
| LDPE (A3) | 98.30 | 0 | 0 | 98.55 | 98.30 | 0 |
| LDPE (A2) | 0 | 98.30 | 98.80 | 0 | 0 | 98.30 |
| Dicumyl Peroxide (C1) | 0.50 | 0.50 | 0.50 | 0.50 | 0.50 | 0.50 |
| (B1) = $(D^{Vi})_3$ | 0 | 0 | 0 | 0 | 1.20 | 0 |
| (B2) = $(D^{Vi})_4$ | 1.20 | 1.20 | 0.70 | 0.50 | 0 | 0 |
| (B3) = $(D^{Vi})_5$ | 0 | 0 | 0 | 0 | 0 | 1.20 |
| TAIC (D1) | 0 | 0 | 0 | 0.45 | 0 | 0 |
| Total | 100.00 | 100.00 | 100.00 | 100.00 | 100.00 | 100.00 |
| Vinyl content (mmol) | 13.9 | 13.9 | 8.1 | 11.2 | 13.9 | 13.9 |

Characterize test samples of the pellets of the compositions of CE1 to CE6 and IE1 to IE6 according to one or more of the T90 Crosslinking Time Test Method, Scorch Time Test Method, and Migration Measurement Test Method. See Tables 3 and 4.

TABLE 3

Characterizations of CE1 to CE6.

| Characterization | CE1 | CE2 | CE3 | CE4 | CE5 | CE6 |
|---|---|---|---|---|---|---|
| Lowest Torque ML at 180° C. (dN-m) | 0.22 | 0.20 | 0.21 | 0.21 | 0.21 | 0.21 |
| Highest Torque MH at 180° C. (dN-m) | 3.56 | 3.52 | 2.95 | 1.89 | 3.39 | 2.93 |
| T90 Crosslinking Time (at 180° C. min.) | 4.64 | 3.93 | 3.57 | 2.60 | 4.36 | 4.41 |
| Was Surface Migration Observed?* | No | No | No | No | No | No |
| Scorch Time ts1 at 140° C. (min.) | 26.5 | 34.8 | 28.3 | 30.5 | 34.6 | 41.3 |

*Initial Migration is determined after 17 hours.

TABLE 4

Characterizations of IE1 to IE6.

| Characterization | IE1 | IE2 | IE3 | IE4 | IE5 | IE6 |
|---|---|---|---|---|---|---|
| Lowest Torque ML at 180° C. (dN-m) | 0.18 | 0.21 | 0.23 | 0.19 | 0.18 | 0.21 |
| Highest Torque MH at 180° C. (dN-m) | 3.16 | 3.70 | 3.13 | 3.13 | 3.52 | 3.31 |
| T90 Crosslinking Time at 180° C. (min.) | 4.55 | 4.29 | 4.13 | 4.68 | 4.27 | 4.08 |
| Was Surface Migration Observed?* | No | No | No | No | No | No |
| Scorch Time ts1 at 140° C. (min.) | 57.5 | 30.3 | 28.2 | 59.0 | 54.7 | 32.9 |

*Initial Migration is determined after 17 hours.

As indicated by comparing the data for CE1 with the data for CE5, to achieve the same curing level, OV-POSS hurts scorch resistance as indicated by shorter Scorch Time ts1 at 140° C. (min.) value for CE5 than that for CE1. As indicated by comparing the data for CE6 with the data for IE1, to achieve the same curing level, the (B) monocyclic organosiloxane improves the scorch resistance as indicated by the longer Scorch Time ts1 at 140° C. (min.) value for IE1 than that for CE6. As indicated by comparing the data for CE2 with the data for CE5, at the presence of the other coagent, triallylisocyanurate, OV-POSS does not hurt scorch resistance indicated by comparable Scorch Time ts1 at 140° C. (min.) value for CE5 than that for CE2. As indicated by comparing the data for CE6 with the data for IE4, at the presence of the other coagent, triallylisocyanurate, the (B) monocyclic organosiloxane still improves scorch resistance indicated by the longer Scorch Time ts1 at 140° C. (min.) value for IE4 than that for CE6. As indicated by comparing the data for CE3 and CE4 with the data for IE6, the phosphazene base (P4-t-Bu) in CE3 and CE4 does not contribute to crosslinking and actually harms (decreases) the crosslinking level as indicated by highest torque MH at 180° C. The value for CE3 and CE4 is significantly lower than the highest torque MH at 180° C. value for IE6. The harmful effect of the phosphazene base on crosslinking level is progressively greater as concentration of the phosphazene base increases (CE3 versus CE4).

The invention claimed is:

1. A polyolefin composition comprising (A) a polyolefin polymer that is a low density polyethylene (LDPE) polymer comprising 50 to 100 weight percent (wt %) ethylenic monomeric units, 50 to 0 wt % ($C_3$-$C_{20}$)alpha-olefin-derived comonomeric units, and 20 to 0 wt % diene comonomeric units, wherein total weight percent is 100.00 wt %; a crosslinking effective amount of (B) a monocyclic organosiloxane of formula (I): $[R^1,R^2SiO_{2/2}]_n$ (I), wherein subscript n is an integer greater than or equal to 3; each $R^1$ is independently a ($C_2$-$C_4$)alkenyl or a $H_2C=C(R^{1a})$—C (=O)—O—$(CH_2)_m$— wherein $R^{1a}$ is H or methyl and subscript m is an integer from 1 to 4; and each $R^2$ is independently H, ($C_1$-$C_4$)alkyl, phenyl, or $R^1$; and (C) an organic peroxide; with the proviso that the polyolefin composition is free of a phosphazene base; wherein subscript n is 3 and the (B) monocyclic organosiloxane of formula (I) is described by any one of limitations (i) to (x): (i) each $R^1$ is independently a ($C_2$-$C_3$)alkenyl; and each $R^2$ is independently H, ($C_1$-$C_2$)alkyl, or ($C_2$-$C_3$)alkenyl; (ii) each $R^1$ is vinyl; and each $R^2$ is independently ($C_1$-$C_2$)alkyl; (iii) each $R^1$ is vinyl; and each $R^2$ is methyl; (iv) each $R^1$ is allyl; and each $R^2$ is independently ($C_1$-$C_2$)alkyl; (v) each $R^1$ is allyl; and each $R^2$ is methyl; (vi) each $R^1$ is independently $H_2C=C(R^{1a})$—C(=O)—O—$(CH_2)_m$— wherein $R^{1a}$ is H or methyl and subscript m is an integer from 1 to 4; and each $R^2$ is independently H, ($C_1$-$C_2$)alkyl, or ($C_2$-$C_3$)alkenyl; (vii) each $R^1$ is independently $H_2C=C(R^{1a})$—C(=O)—O—$(CH_2)_m$— wherein $R^{1a}$ is H and subscript m is 3; and each $R^2$ is independently ($C_1$-$C_2$)alkyl; (viii) each $R^1$ is independently $H_2C=C(R^{1a})$—C(=O)—O—$(CH_2)_m$— wherein $R^{1a}$ is methyl and subscript m is 3; and each $R^2$ is independently ($C_1$-$C_2$)alkyl; (ix) the polyolefin composition does not contain 24 wt % or more of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

2. A polyolefin composition comprising (A) a polyolefin polymer that is a low density polyethylene (LDPE) polymer comprising 50 to 100 weight percent (wt %) ethylenic monomeric units, 50 to 0 wt % ($C_3$-$C_{20}$)alpha-olefin-derived comonomeric units, and 20 to 0 wt % diene comonomeric units, wherein total weight percent is 100.00 wt %; a crosslinking effective amount of (B) a monocyclic organosiloxane of formula (I): $[R^1,R^2SiO_{2/2}]_n$ (I), wherein subscript n is an integer greater than or equal to 3; each $R^1$ is independently a ($C_2$-$C_4$)alkenyl or a $H_2C=C(R^{1a})$—C (=O)—O—$(CH_2)_m$— wherein $R^{1a}$ is H or methyl and subscript m is an integer from 1 to 4; and each $R^2$ is independently H, ($C_1$-$C_4$)alkyl, phenyl, or $R^1$; and (C) an organic peroxide; with the proviso that the polyolefin composition is free of a phosphazene base; wherein subscript n is 5 or 6 and the (B) monocyclic organosiloxane of formula (I) is described by any one of limitations (i) to (x): (i) each $R^1$ is independently a ($C_2$-$C_3$)alkenyl; and each $R^2$ is independently H, ($C_1$-$C_2$)alkyl, or ($C_2$-$C_3$)alkenyl; (ii) each $R^1$ is vinyl; and each $R^2$ is independently ($C_1$-$C_2$)alkyl; (iii) each $R^1$ is vinyl; and each $R^2$ is methyl; (iv) each $R^1$ is allyl; and each $R^2$ is independently ($C_1$-$C_2$)alkyl; (v) each $R^1$ is allyl; and each $R^2$ is methyl; (vi) each $R^1$ is independently $H_2C=C(R^{1a})$—C(=O)—O—$(CH_2)_m$— wherein $R^{1a}$ is H or methyl and subscript m is an integer from 1 to 4; and each $R^2$ is independently H, ($C_1$-$C_2$)alkyl, or ($C_2$-$C_3$)alkenyl; (vii) each $R^1$ is independently $H_2C=C(R^{1a})$—C(=O)—O—$(CH_2)_m$— wherein $R^{1a}$ is H and subscript m is 3; and each $R^2$ is independently ($C_1$-$C_2$)alkyl; (viii) each $R^1$ is independently $H_2C=C(R^{1a})$—C(=O)—O—$(CH_2)_m$— wherein $R^{1a}$ is methyl and subscript m is 3; and each $R^2$ is independently ($C_1$-$C_2$)alkyl; (ix) the polyolefin composition does not contain 24 wt % or more of an inorganic filler selected from the group consisting of aluminum oxide, aluminum silicate, calcium silicate, magnesium silicate, silica, titanium dioxide, and mixtures thereof; and (x) a combination of limitation (ix) and any one of limitations (i) to (viii).

3. The polyolefin composition of claim 1 described by any one of limitations (i) to (vii): (i) the (A) polyolefin polymer is characterized by a density from 0.86 to 0.97 gram per cubic centimeter (g/cm$^3$) as measured by ASTM D792-13, Method B, in 2-propanol; (ii) the (A) polyolefin polymer is from 80 to 99.89 weight percent (wt %) of the weight of the polyolefin composition; (iii) the (B) monocyclic organosiloxane of formula (I) is from 0.1 to 3 wt % of the polyolefin composition; and the (C) organic peroxide is from 0.01 to 4.5 wt % of the polyolefin composition; (iv) both (i) and (ii); (v) both (i) and (iii); (vi) both (ii) and (iii); and (vii) each of (i), (ii), and (iii).

4. The polyolefin composition of claim 1 further comprising at least one additive selected from the group consisting of: (D) a conventional coagent; (E) an antioxidant; (F) a filler; (G) a flame retardant; (H) a hindered amine stabilizer; (I) a tree retardant; (J) a methyl radical scavenger; (K) a scorch retardant, (L) a nucleating agent, and (M) carbon black; with the proviso that the total amount of the at least one additive is from >0 to 70 wt % of the polyolefin composition and with the proviso that the (F) filler does not include any omitted filler; wherein the omitted filler is the inorganic filler selected from the group consisting of aluminum oxide, aluminum silicate, calcium silicate, magnesium silicate, silica, titanium dioxide, and mixtures thereof.

5. A method of making a polyolefin composition, the method comprising mixing (A) a polyolefin polymer and (B) a monocyclic organosiloxane of formula (I): $[R^1,R^2SiO_{2/2}]_n$ (I) and (C) an organic peroxide together in the absence of a phosphazene base to make the polyolefin composition of claim 1.

6. A method of free-radical curing a polyolefin composition of claim 1 to make a crosslinked polyolefin product, the method comprising heating the polyolefin composition at a curing effective temperature with (C) an organic peroxide in such a way so as to react the (A) polyolefin polymer with the (B) monocyclic organosiloxane of formula (I), thereby making a crosslinked polyolefin product.

7. A crosslinked polyolefin product made by the method of curing of claim 6.

8. A manufactured article comprising a shaped form of the polyolefin composition of claim 1.

9. A coated conductor comprising a conductive core and an insulation layer at least partially covering the conductive core, wherein at least a portion of the insulation layer comprises the polyolefin composition of claim 1.

10. A method of transmitting electricity, the method comprising applying a voltage across the conductive core of the coated conductor of claim 9 so as to generate a flow of electricity through the conductive core.

11. The polyolefin composition of claim 2 described by any one of limitations (i) to (vii): (i) the (A) polyolefin polymer is characterized by a density from 0.86 to 0.97 gram per cubic centimeter (g/cm$^3$) as measured by ASTM D792-13, Method B, in 2-propanol; (ii) the (A) polyolefin polymer is from 80 to 99.89 weight percent (wt %) of the weight of the polyolefin composition; (iii) the (B) monocyclic organosiloxane of formula (I) is from 0.1 to 3 wt % of the polyolefin composition; and the (C) organic peroxide is from 0.01 to 4.5 wt % of the polyolefin composition; (iv) both (i) and (ii); (v) both (i) and (iii); (vi) both (ii) and (iii); and (vii) each of (i), (ii), and (iii).

12. The polyolefin composition of claim 2 further comprising at least one additive selected from the group consisting of: (D) a conventional coagent; (E) an antioxidant; (F) a filler; (G) a flame retardant; (H) a hindered amine stabilizer; (I) a tree retardant; (J) a methyl radical scavenger; (K) a scorch retardant, (L) a nucleating agent, and (M) carbon black; with the proviso that the total amount of the at least one additive is from >0 to 70 wt % of the polyolefin composition and with the proviso that the (F) filler does not include any omitted filler; wherein the omitted filler is the inorganic filler selected from the group consisting of aluminum oxide, aluminum silicate, calcium silicate, magnesium silicate, silica, titanium dioxide, and mixtures thereof.

13. A method of making a polyolefin composition, the method comprising mixing (A) a polyolefin polymer and (B) a monocyclic organosiloxane of formula (I): $[R^1,R^2SiO_{2/2}]_n$ (I) and (C) an organic peroxide together in the absence of a phosphazene base to make the polyolefin composition of claim 2.

14. A method of free-radical curing a polyolefin composition of claim 2 to make a crosslinked polyolefin product, the method comprising heating the polyolefin composition at a curing effective temperature with (C) an organic peroxide in such a way so as to react the (A) polyolefin polymer with the (B) monocyclic organosiloxane of formula (I), thereby making a crosslinked polyolefin product.

15. A crosslinked polyolefin product made by the method of curing of claim 14.

16. A manufactured article comprising a shaped form of the polyolefin composition of claim 2.

17. A coated conductor comprising a conductive core and an insulation layer at least partially covering the conductive core, wherein at least a portion of the insulation layer comprises the polyolefin composition of claim 2.

18. A method of transmitting electricity, the method comprising applying a voltage across the conductive core of the coated conductor of claim 17 so as to generate a flow of electricity through the conductive core.

\* \* \* \* \*